April 8, 1969 R. D. PEACOCK 3,436,809
METHOD OF MAKING SEMICONDUCTOR DEVICES
Filed Sept. 29, 1965 Sheet 1 of 2

Inventor
ROBERT D. PEACOCK
By Percy P. Lantzy
Attorney

Inventor
ROBERT D. PEACOCK
By Percy P. Lantzy
Attorney

United States Patent Office 3,436,809
Patented Apr. 8, 1969

3,436,809

METHOD OF MAKING SEMICONDUCTOR DEVICES

Robert David Peacock, London, England, assignor to International Standard Electric Corporation, New York, N.Y., a corporation of Delaware Filed Sept. 29, 1965, Ser. No. 491,251
Claims priority, application Great Britain, Nov. 9, 1964, 45,545/64
Int. Cl. H01l 5/00, 7/18
U.S. Cl. 29—578 5 Claims

ABSTRACT OF THE DISCLOSURE

This is a method of making semiconductor devices by subjecting a portion of a previously diffused region to heat in a predetermined atmosphere so that this portion of the diffused region would develop either a heavier impurity concentration (by in-diffusion) or a lower impurity concentration (by out-diffusion) than the remaining portion of the previously diffused region. Aluminum is then deposited on that portion of the diffused region which now has a lower impurity concentration than the remaining portion. The aluminum is alloyed in and forms the emitter region while the remaining heavily diffused region forms the base region for the device. This method produces a transistor having low collector base capacitance and low base resistance which provides for improved high frequency power gain.

Figure 1:
Figure 2:
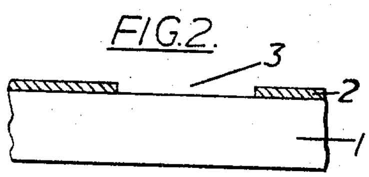
Figure 3:
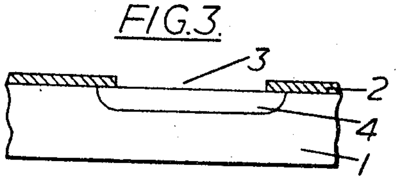
Figure 4:
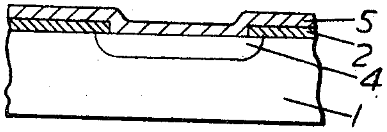
Figure 5:
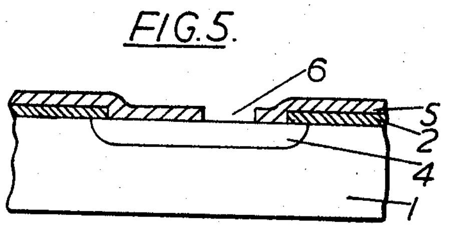
Figure 6:
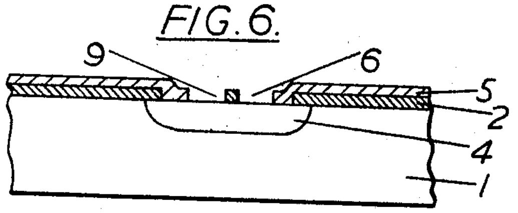
Figure 7:
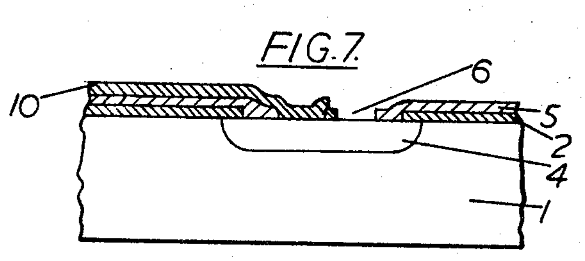
Figure 8:
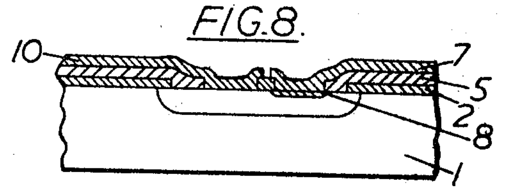

The present invention relates to the manufacture of semiconductor devices.

It is an object of the present invention to provide an improved means of production of semiconductor devices for ultra high frequency applications.

According to one aspect of the present invention there is provided a method of making semiconductor devices including the steps of depositing a first layer of insulating material on at least one surface of a slice of semiconductor material, photolithographically etching holes through said first layer of insulating material exposing said surface, diffusing an impurity material into the surface of said semiconducting material, said first layer of insulating material inhibiting the penetration of the impurity material other than in the exposed regions of said surface, depositing a second insulating layer over said surface and photolithographically etching holes through said second insulating layer exposing part of said surface within the confines of the region previously exposed, subjecting the slice of semiconductor material to a heating process wherein some of said impurity material is permitted to diffuse out of said slice through said holes in the second insulating layer, applying a metallic contact layer to said surface and alloying it with said semiconductor material within the confines of said holes in the second insulating layer photolithographically etching further holes through said second insulating layer within the confines of the holes in said first insulating layer and applying further metallic contacts to said surface through said further holes.

According to another aspect of the invention there is provided a method of making semiconductor devices, including the steps of depositing a first layer of insulating material on at least one surface of a slice of semiconductor material, photolithographically etching holes through said first layer of insulating material exposing regions of said surface, diffusing an impurity material into the surface of said semiconductor material, said first layer of insulating material inhibiting penetration of the impurity material other than in the exposed regions of said surface, depositing a second insulating layer over said surface and photolithographically etching holes through said second insulating layer exposing part of said surface within the confines of the regions previously exposed, diffusing more of said impurity material into the surface of said semiconductor material, photolithographically etching further holes in said second insulating layer exposing said surface within the confines of the holes in the first insulating layer, applying metallic contact material to said surface and alloying it with said semiconductor material within the confines of said further holes in said second insulating layer and applying further metallic contacts to said surface through the first set of holes in said second insulating layer.

According to a yet further aspect there is provided a method of making semiconductor devices including the steps of depositing a first layer of insulating material on at least one surface of a slice of semiconductor material, photolithographically etching holes through said first layer of insulating material exposing regions of said surface, diffusing an impurity material into the surface of said semiconductor material, the first insulating layer inhibiting penetration of the impurity material other than in the exposed regions of said surface, depositing a second insulating layer over said surface and photolithographically etching holes through said second insulating layer exposing part of said surface within the confines of the regions previously exposed, diffusing a further amount of said impurity material into the surface of said semiconductor material, depositing a third insulating layer over said surface and photolithographically etching holes through both said second and said third insulating layer and through said third alone exposing said surface within the confines of the holes in said first insulating layer, applying metallic contact material to said surface and alloying it with said semiconductor material within the confines of the holes in said second and third insulating layers and applying further metallic contacts to said surface through the holes in said third insulating layer alone.

Suitable insulating materials for the purposes of the present invention are those which will withstand the high-temperature processing steps and in which the diffusion coefficient of the conductivity-type determining impriority materials employed is appreciably lower than the diffusion coefficient at the same temperature of those materials in the semiconductor material.

Figure 9:
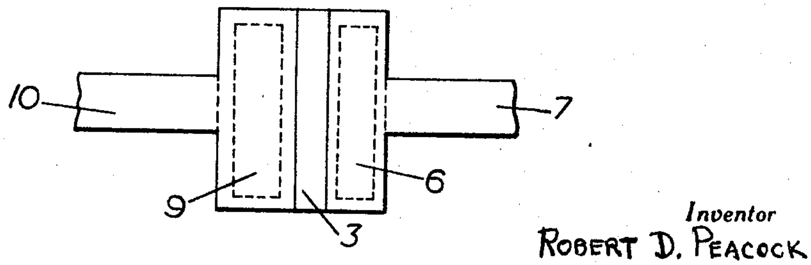

A specific embodiment of the invention will now be described with reference to the accompanying drawings in which, FIGURES 1 to 8 are diagrammatic views showing in cross-section a portion of the slice of semiconductor material at different stages in the manufacture of transistors; and FIGURE 9 is a plan view of part of a slice showing the arrangement of a single transistor.

Referring now to the drawings; a slice of p-type germanium 1 of resistivity in the range 1 to 4 ohm-cm. is prepared by lapping and etching, and one face of it is coated with a layer of silica 2 of thickness 2000–4000 A. by a known process, such as pyrolytic deposition from tetraethyoxysilane.

The coated surface of the slice is masked using conventional photolithographic techniques and holes 3 are etched through the silica layer exposing the surface of the germanium.

Arsenic is diffused into the germanium through these holes 3 by heating the slice in an atmosphere containing arsenic vapour. The vapour pressure of the arsenic and the time and temperature of the diffusion process are controlled to give a junction depth of about one micron and an impurity surface concentration of greater than $10^{19}$ atoms per cm.$^3$. The arsenic diffused layer is shown at 4.

A second silica layer 5 is then deposited on the slice. Preferably this deposition is made by a low temperature process such as deposition from oxidised silane, so that the effect of diffusion of arsenic during the deposition may be ignored.

Holes 6 are then etched through this second silica layer, within the holes 3 already etched through the first silica layer. The slice is then subjected to a further heating cycle during which some of the arsenic atoms close to the surface diffuse out through the holes 6 to the surface of the slice and are carried away by the ambient gas. This out-diffusion does not take place to a significant extent from regions covered by a silica layer. The time and temperature of the out-diffusion process are such that the surface concentration of the arsenic atoms within the holes 6 is reduced to less than $10^{19}$ atoms per $cm.^3$. The purpose of this process is to improve the emitter efficiency and breakdown voltage of the finished devices.

Next, further holes 9 are etched in the second silicon layer within the confines of the holes 3 in the first silica layer.

Graded gold-chromium contacts 10 to the germanium surface are then made through these holes by a process such as that described in U.K. Patent No. 1,010,111 and U.S. Patent No. 3,270,256. For instance, the contact layer may vary from substantially 100 percent of chromium at the semiconductor side to substantially 100 percent of gold at the opposite side.

A layer of aluminum approximately 0.5 micron thick is then evaporated over the silica coated surface. Using photolithographic techniques, contact areas 7 are formed. These are alloyed to the germanium through the holes 6 and form p-type recrystallised layers 8, which act as emitters in the finished transistors.

Finally the slice is separated into dice containing individual transistors which are then mounted on headers and encapsulated by known methods.

Using the processes described above it is possible to produce devices having a collector-base junction area of less than $2 \times 10^{-6}$ square inches, resulting in very low values of collector base capacitance and yielding increased high frequency power gain. The low value of extrinsic base resistance resulting from high base impurity surface concentration also gives rise to an improved high frequency power gain.

It is possible to slightly alter the processing and achieve an equivalent final result.

The initial arsenic diffusion is controlled to give an impurity surface concentration of about $10^{19}$ atoms per $cm.^3$. Silica is then deposited as before and etched photolithographically within the confines of the holes 3 in the oxide layer 2 leaving an oxide layer in the area to be ultimately occupied by the emitter. A further arsenic diffusion is then made to increase the impurity surface concentration. A further silica layer is then deposited over the slice and holes are etched through the second and third oxide layers and an alloyed aluminium emitter contact applied to the slice in the above manner. A gold-chrome base contact to the germanium is made as previously described.

The need for a third silica deposition may be eliminated if the region left when the second silica layer is etched is not completely isolated from the first silica layer.

While the manufacture of pnp germanium transistors is shown using aluminium and arsenic as conductivity type determining impurities it will be appreciated that the principles involved are equally applicable to the manufacture of npn transistors and the use of other semiconductor materials and conductivity-type determining impurities.

It is to be understood that the foregoing description of specific examples of this invention is not to be considered as a limitation on its scope.

What I claim is:

1. A method of making semiconductor devices, including the steps of depositing a first layer of insulating material on at least one surface of a slice of semiconductor material of one conductivity type, photolithographically etching holes through said first layer of insulating material exposing said surface, diffusing an impurity material into the surface of said semiconducting material of a concentration greater than $10^{19}$ atoms per $cm.^3$ forming a region of opposite conductivity type, said first layer of insulating material inhibiting the penetration of the impurity material other than in the exposed regions of said surface, depositing a second insulating layer over said surface and photolithographically etching holes through said second insulating layer exposing part of said surface within the confines of the regions previously exposed, diffusing impurity material out of said slice through said holes in the second insulating layer by subjecting the slice of semiconductor material to a heating process at a specific temperature and for a specific time to reduce the concentration of impurity material to less than $10^{19}$ atoms per $cm.^3$ in said exposed part of said surface, applying a metallic contact layer to said surface and alloying it with said semiconductor material within the confines of said holes in the second insulating layer, photolithographically etching further holes through said second insulating layer within the confines of the holes in said first insulating layer and applying further metallic contacts to said surface through said further holes.

2. A method as claimed in claim 1 wherein the semiconductor material is germanium.

3. A method as claimed in claim 2 wherein said further metallic contacts are of a layer of chromium and gold, graded from substantially 100 percent chromium at the surface in contact with the semiconductor material to substantially 100 percent gold at the surface remote from the semiconductor material.

4. A method as claimed in claim 2 wherein said impurity material is arsenic.

5. A method as claimed in claim 4 wherein said metallic contacts are of aluminium.

References Cited

UNITED STATES PATENTS

| | | | |
|---|---|---|---|
| 2,792,540 | 5/1957 | Pfann. | |
| 2,981,877 | 4/1961 | Noyce. | |
| 3,044,147 | 7/1962 | Armstrong | 29—583 |
| 3,199,002 | 8/1965 | Martin | 29—577 XR |
| 3,212,162 | 10/1965 | Moore. | |
| 3,266,127 | 8/1966 | Harding et al. | 29—590 XR |
| 3,270,256 | 8/1966 | Mills et al. | |

WILLIAM I. BROOKS, *Primary Examiner.*

U.S. Cl. X.R.

29—589; 148—187; 317—235